US012369256B2

(12) United States Patent
Ethridge et al.

(10) Patent No.: US 12,369,256 B2
(45) Date of Patent: Jul. 22, 2025

(54) BACK DRILLING VIAS OF A PRINTED CIRCUIT BOARD

(71) Applicant: Dell Products L.P., Round Rock, TX (US)

(72) Inventors: Steven Richard Ethridge, Austin, TX (US); Ching-Huei Chen, Taoyuan (TW); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 562 days.

(21) Appl. No.: 17/457,095

(22) Filed: Dec. 1, 2021

(65) Prior Publication Data

US 2023/0171898 A1    Jun. 1, 2023

(51) Int. Cl.
*H05K 3/00* (2006.01)
*B23B 35/00* (2006.01)
*H05K 3/40* (2006.01)

(52) U.S. Cl.
CPC ........... *H05K 3/0047* (2013.01); *B23B 35/00* (2013.01); *H05K 3/4038* (2013.01); *H05K 2203/0207* (2013.01); *Y10T 408/03* (2015.01); *Y10T 408/20* (2015.01)

(58) Field of Classification Search
CPC ............... H05K 3/0047; H05K 3/4038; H05K 2203/0207; H05K 2203/0214; Y10T 408/03; Y10T 408/173; Y10T 408/20; B23B 2220/32; B23B 2220/40–445; B23B 2270/56; B23B 35/00
USPC .............................................. 408/1 R, 12, 15
See application file for complete search history.

(56) References Cited

U.S. PATENT DOCUMENTS

| | | | |
|---|---|---|---|
| 7,337,537 B1* | 3/2008 | Smetana, Jr. .......... | H05K 3/429 427/97.1 |
| 7,669,321 B1* | 3/2010 | Levy .................... | H05K 1/0268 29/402.06 |
| 9,894,773 B2* | 2/2018 | Robertson ............ | H05K 3/0047 |
| 2010/0319979 A1* | 12/2010 | Hsu ...................... | H05K 1/0251 174/262 |

(Continued)

FOREIGN PATENT DOCUMENTS

| | | | | |
|---|---|---|---|---|
| CN | 105025658 A | * | 11/2015 | |
| CN | 112165781 A | * | 1/2021 | ........... H05K 3/0047 |
| CN | 109640528 B | * | 5/2021 | ........... H05K 3/0047 |

*Primary Examiner* — Sunil K Singh
*Assistant Examiner* — Michael Vitale
(74) *Attorney, Agent, or Firm* — McDermott Will & Emery LLP (57) ABSTRACT

Back drilling vias of a PCB, including: identifying a particular diameter of a particular via of multiple vias of the PCB; back drilling of the particular via with a first drill bit having a first diameter, the first diameter a first percentage greater than the particular diameter of the particular via; determining whether the first diameter of the first drill bit is a threshold percentage greater than the particular diameter of the particular via; determining that the first diameter of the first drill bit is less than the threshold percentage greater than the particular diameter of the particular via, and in response: back drilling of the particular via with a second drill bit having a second diameter, the second diameter a second percentage greater than the particular diameter of the particular via, the second diameter greater than the first diameter.

8 Claims, 9 Drawing Sheets (56) References Cited

U.S. PATENT DOCUMENTS

| | | | |
|---|---|---|---|
| 2015/0047892 A1* | 2/2015 | Yang .................... | H05K 3/0047 |
| | | | 174/262 |
| 2017/0231099 A1* | 8/2017 | Mundt ................. | H05K 3/0047 |
| 2017/0232527 A1* | 8/2017 | Henry ....................... | B23C 1/08 |
| | | | 408/1 R |
| 2019/0141840 A1* | 5/2019 | Thompson ............. | H05K 3/429 |
| 2022/0371103 A1* | 11/2022 | Duan ..................... | B23B 35/00 |

* cited by examiner

BACK DRILLING VIAS OF A PRINTED CIRCUIT BOARD

BACKGROUND

Field of the Disclosure

The disclosure relates generally to back drilling of vias of a printed circuit board (PCB).

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As signal speeds continue to increase on printed circuit boards (PCB), small parasitic effects can begin to have a larger impact. The PCB can be sensitive to routing imperfections, and via stubs can adversely impact signal integrity.

SUMMARY

Innovative aspects of the subject matter described in this specification may be embodied in a method of back drilling vias of a printed circuit board (PCB), the method including identifying a particular diameter of a particular via of multiple vias of a printed circuit board (PCB) from a first side of the PCB; back drilling of the particular via from a second side of the PCB, opposite of the first side, including: back drilling of the particular via with a first drill bit having a first diameter, the first diameter a first percentage greater than the particular diameter of the particular via at the first side of the PCB; determining whether the first diameter of the first drill bit is a threshold percentage greater than the particular diameter of the particular via at the first side of the PCB; determining that the first diameter of the first drill bit is less than the threshold percentage greater than the particular diameter of the particular via at the first side of the PCB, and in response: back drilling of the particular via with a second drill bit having a second diameter, the second diameter a second percentage greater than the particular diameter of the particular via at the first side of the PCB, the second diameter greater than the first diameter; determining whether the second diameter of the second drill bit is the threshold percentage greater than the particular diameter of the particular via at the first side of the PCB; and determining that the second diameter of the second drill bit is at least the threshold percentage greater than the particular diameter of the particular via at the first side of the PCB, and in response, back drilling of the particular via with a third drill bit having a third diameter, the third diameter greater than the second diameter.

Other embodiments of these aspects include corresponding systems and apparatus.

These and other embodiments may each optionally include one or more of the following features. For instance, after back drilling of the particular via with the third drill bit, back drilling of the particular via with the third drill bit a second time. After back drilling of the particular via with the first drill bit, performing desmearing and/or deburring at the particular via. The threshold percentage is greater than the first percentage. Determining that the second diameter of the second drill bit is less than the threshold percentage greater than the particular diameter of the particular via, and in response: back drilling of the particular via with a fourth drill bit having a fourth diameter, the fourth diameter a fourth percentage greater than the particular diameter of the particular via, the fourth diameter greater than the second diameter; determining whether the fourth diameter of the fourth drill bit is at least the threshold percentage greater than the particular diameter of the particular via at the first side of the PCB; and determining that the fourth diameter of the fourth drill bit is at least the threshold percentage greater than the particular diameter of the particular via at the first side of the PCB, and in response, back drilling of the particular via with the third drill bit. The third diameter of the third drill bit is greater than the fourth diameter of the fourth drill bit. The particular via is plated, wherein back drilling of the particular via includes removing a portion of the plated particular via between the second side of the PCB and a distance between the first side and the second side of the PCB. Removing the portion of the plated particular via between the second side of the PCB and the distance between the first side and the second side of the PCB including removing a particular percentage of the portion of the plated particular via between the second side of the PCB and the distance between the first side and the second side of the PCB. The particular percentage is greater than ninety-nine percent.

Particular implementations of the subject matter described in this specification can be implemented so as to realize one or more of the following advantages. For example, a probability of mis-registration of drill bits with respect to the vias is reduced; a probability of via stripping is reduced; and a length of the via stripe is reduced.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses methods and systems for back drilling of vias of a printed circuit board (PCB). In short, a back drilling system that back drills vias of a printed circuit board (PCB) can be controlled. Back drilling of the vias can minimize and/or reduce stub length of the vias. The vias can be back drilled with a drill bit diameter that is larger than the diameter of the via to remove plating on sidewalls of the via. Residual plating (stripping) after the initial back drilling can be removed by back drilling the via multiple times with increasing drill bit sizes.

Specifically, this disclosure discusses a system and a method of back drilling vias of a printed circuit board (PCB), the method comprising identifying a particular diameter of a particular via of multiple vias of a printed circuit board (PCB) from a first side of the PCB; back drilling of the particular via from a second side of the PCB, opposite of the first side, including: back drilling of the particular via with a first drill bit having a first diameter, the first diameter a first percentage greater than the particular diameter of the particular via at the first side of the PCB; determining whether the first diameter of the first drill bit is a threshold percentage greater than the particular diameter of the particular via at the first side of the PCB; determining that the first diameter of the first drill bit is less than the threshold percentage greater than the particular diameter of the particular via at the first side of the PCB, and in response: back drilling of the particular via with a second drill bit having a second diameter, the second diameter a second percentage greater than the particular diameter of the particular via at the first side of the PCB, the second diameter greater than the first diameter; determining whether the second diameter of the second drill bit is the threshold percentage greater than the particular diameter of the particular via at the first side of the PCB; and determining that the second diameter of the second drill bit is at least the threshold percentage greater than the particular diameter of the particular via at the first side of the PCB, and in response, back drilling of the particular via with a third drill bit having a third diameter, the third diameter greater than the second diameter.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Figure 1:
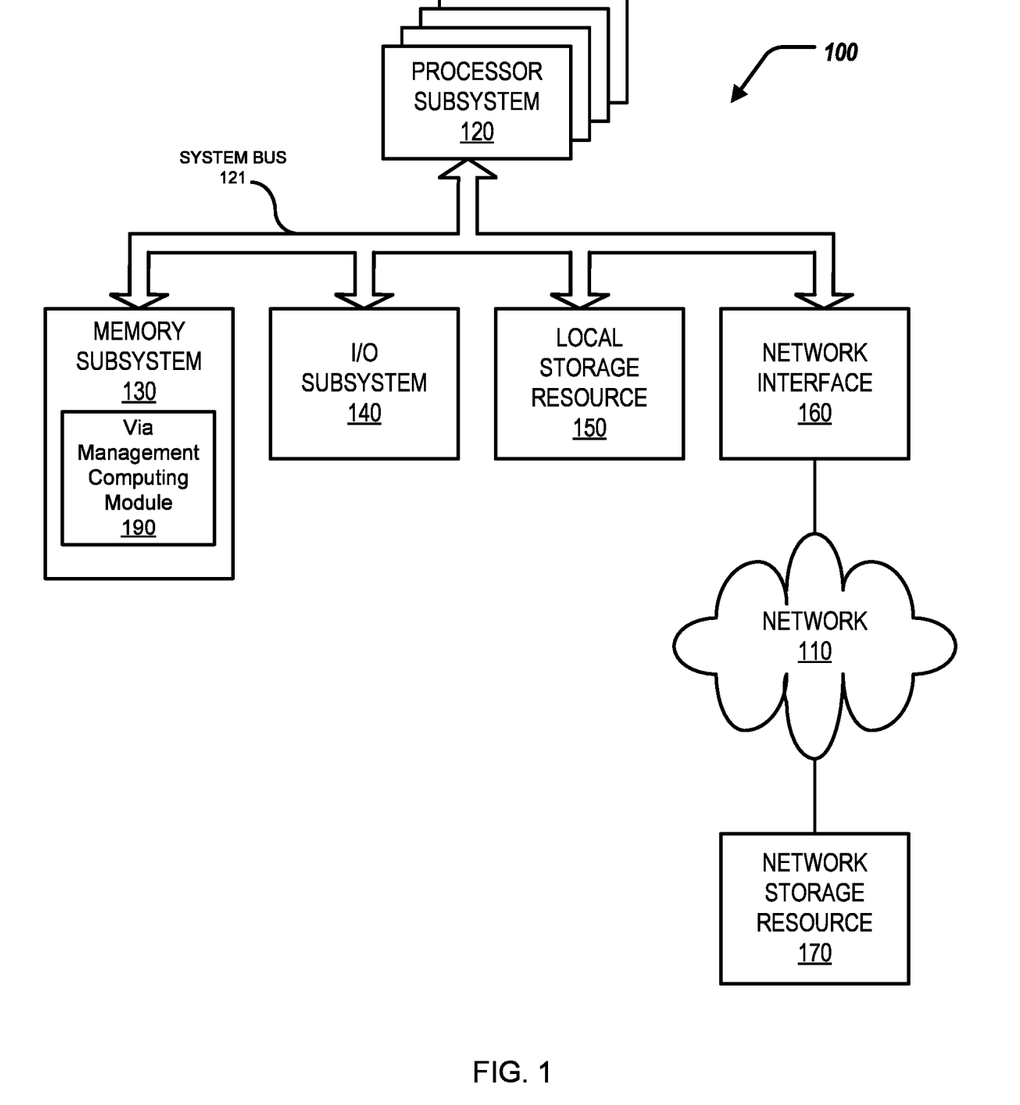
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a via management computing module 190. The via management computing module 190 can be included by the memory subsystem 130. The via management computing module 190 can include a computer-executable program (software). The via management computing module 190 can be executed by the processor subsystem 120.

In short, the via management computing module 190 can control a back drilling system that back drills vias of a printed circuit board (PCB). Back drilling of the vias can minimize and/or reduce stub length of the vias. The vias can be back drilled with a drill bit diameter that is larger than the diameter of the via to remove plating on sidewalls of the via. Residual plating (stripping) after the initial back drilling can be removed by back drilling the via multiple times with increasing drill bit sizes.

Figure 2:
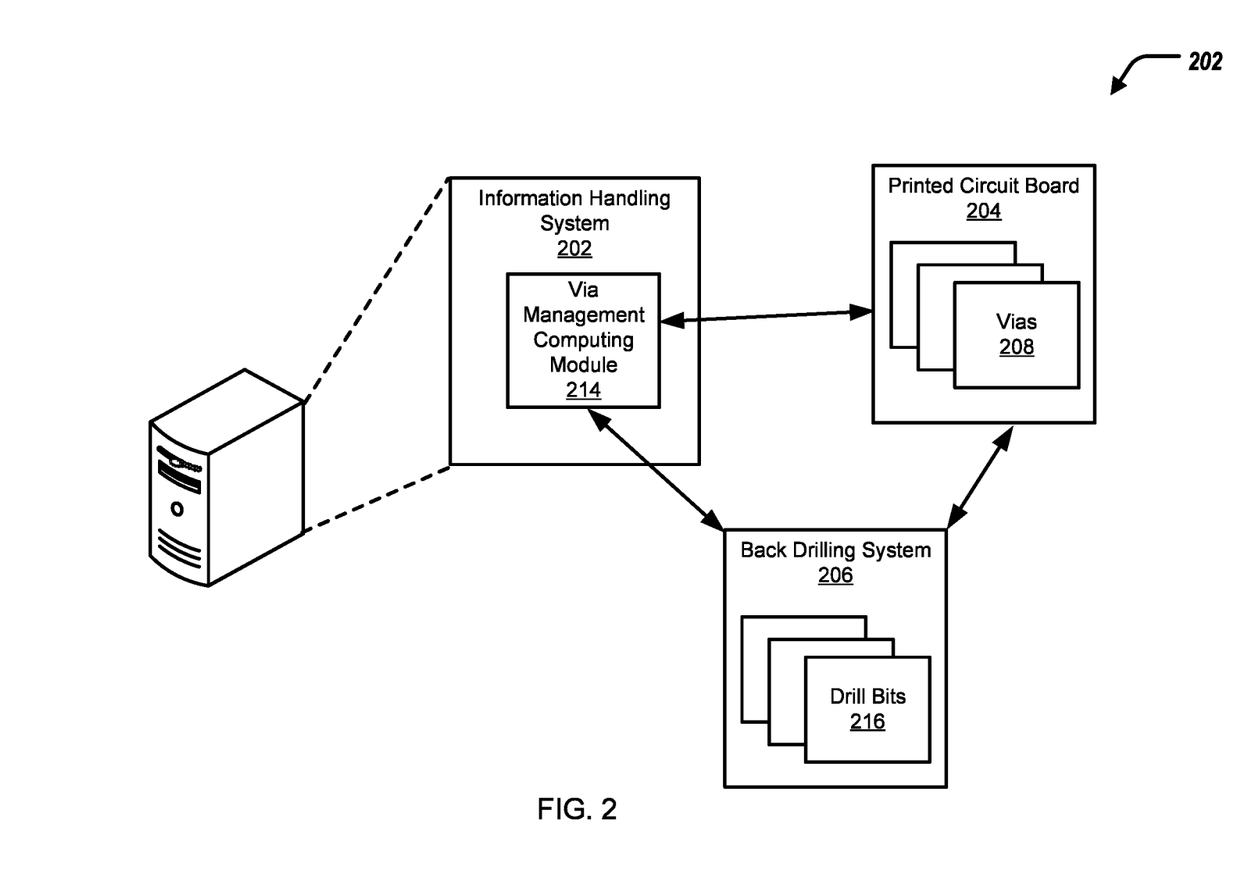
FIG. 2 illustrates a block diagram of an information handling system for back drilling of vias of a printed circuit board (PCB).

Turning to FIG. 2, FIG. 2 illustrates an environment 200 including an information handling system 202, a printed circuit board (PCB) 204, and a back drilling system 206. The information handling system 202 can include a via management computing module 214. In some examples, the information handling system 202 is similar to, or includes, the information handling system 100 of FIG. 1. In some examples, the via management computing module 214 is the same, or substantially the same, as the via management computing module 190 of FIG. 1.

The via management computing module 214 can be in communication with the back drilling system 206 and the PCB 204.

In short, the via management computing module 214 can provide control signals to the back drilling system 206 to manage back drilling of vias 208 of the PCB 204 by drill bit(s) 216 of the back drilling system 206.

Figure 3A:
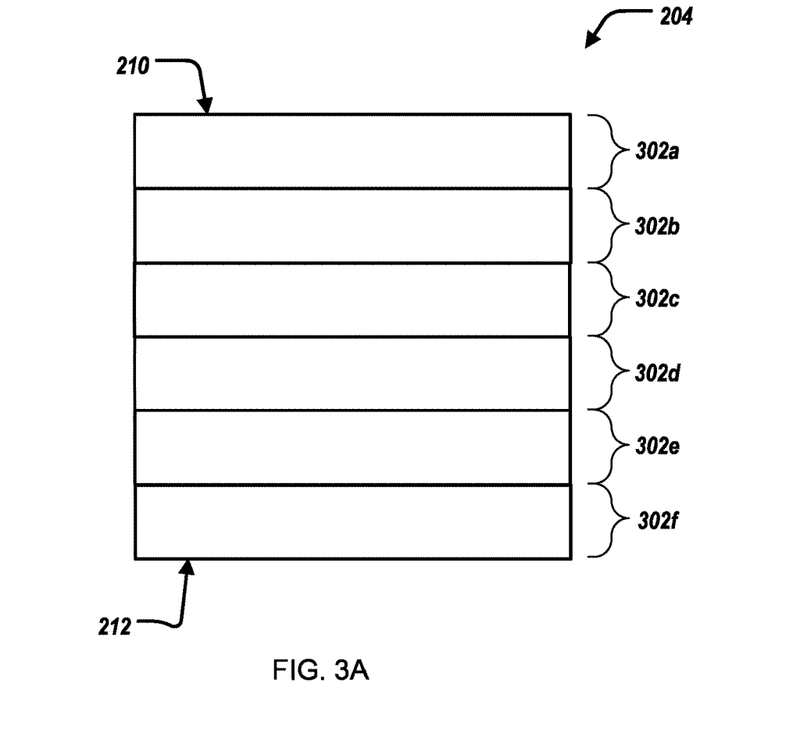
FIGS. 3A-3G illustrate cut-away side views of the PCB during stages of back drilling.

FIG. 3A illustrates a cut-away side view of the PCB 204. The PCB 204 can include a plurality of layers 302a, 302b, 302c, 302d, 302e, 302f (collectively referred to as layers 302). The PCB 204 can include a first side 210 and a second side 212 opposite to the first side 210.

Figure 3B:
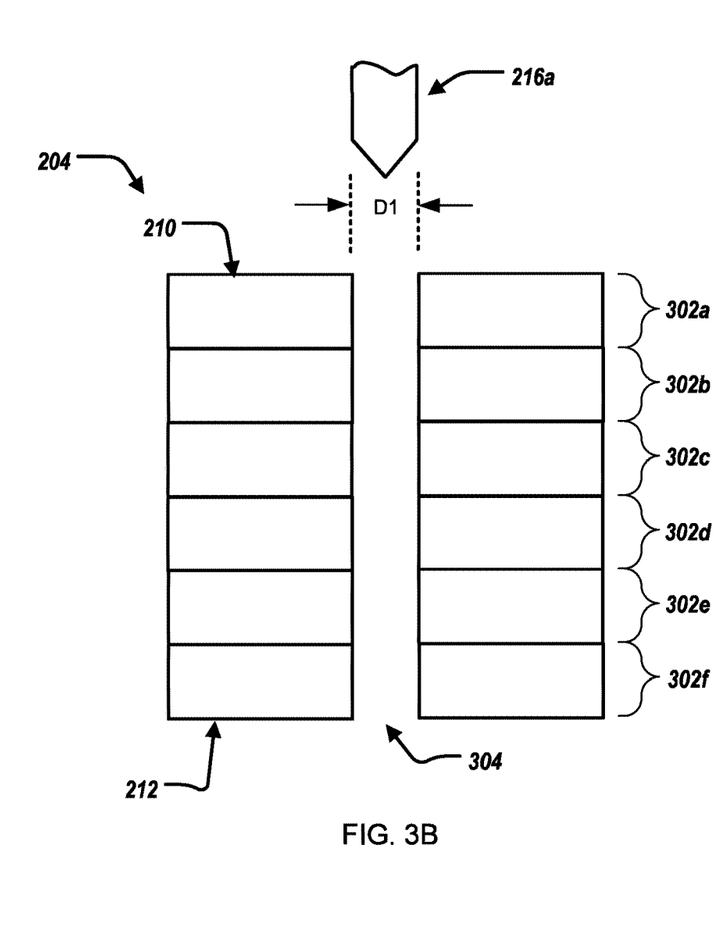

FIG. 3B illustrates a cut-away side view of the PCB 204, after formation of a via 304. Specifically, the via management computing module 214 can send a control signal to the back drilling system 206 such that a first drill bit 216a (of the drill bits 216) forms the via 304 through the layers 302 of the PCB 204. The first drill bit 216a can be associated with a diameter D1 such that the via 304 has the diameter D1.

Figure 3C:
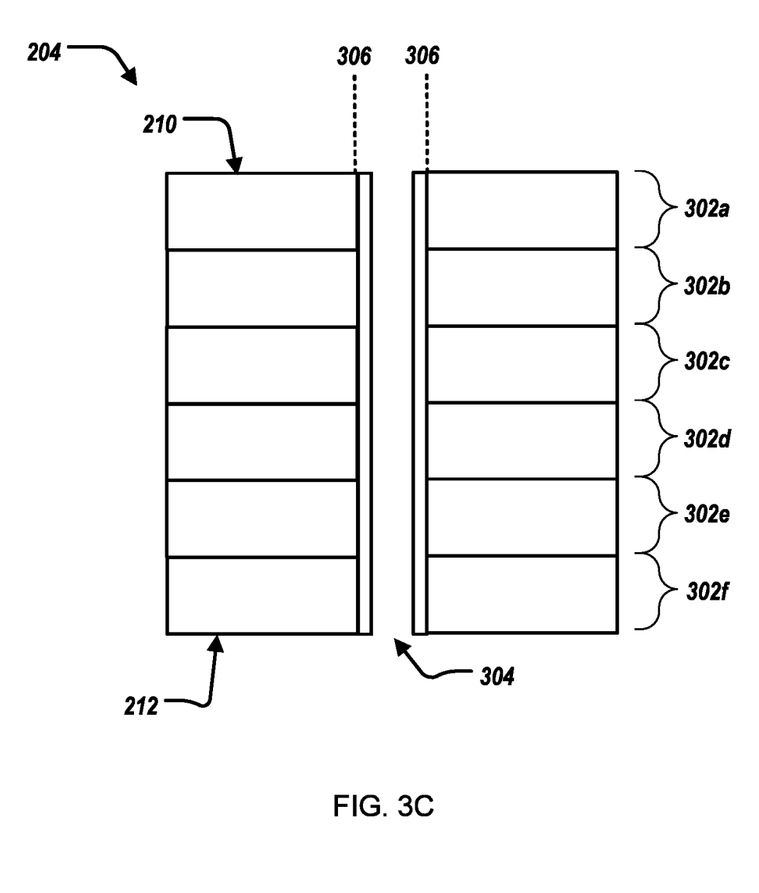

FIG. 3C illustrates a cut-away side view of the PCB 204, after plating of the via 304. Specifically, the via 304 can be plated (by electroplating) on sidewalls 306 of the via 304 with an electrically conductive material (e.g., copper) that forms an electrical connection between two or more of the layers 302.

To that end, when an electrical connection is needed between layers 302a and 302c, the plating 306 between layers 302d and the second side 212 of the PCB 204 can be removed by back drilling, described further herein.

Figure 3D:
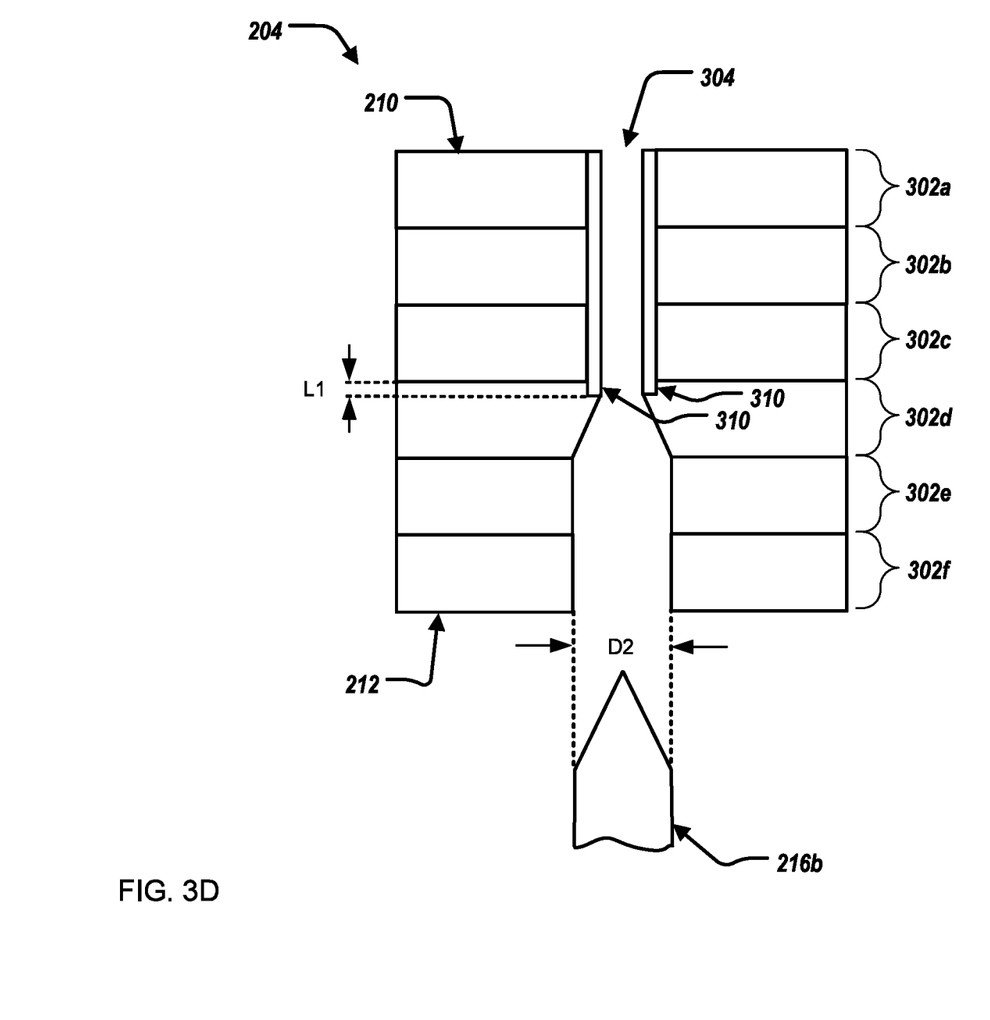
Figure 3E:
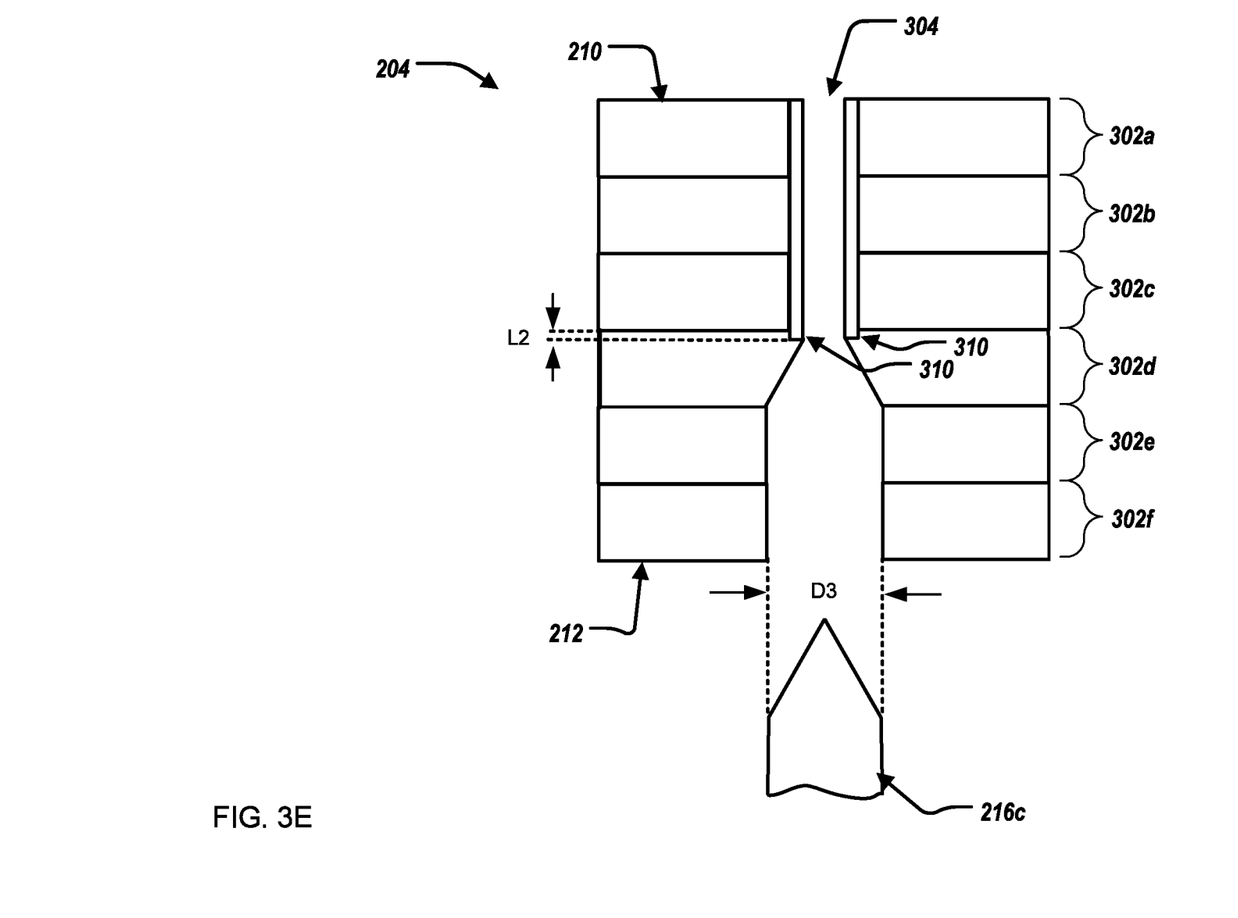
Figure 3F:
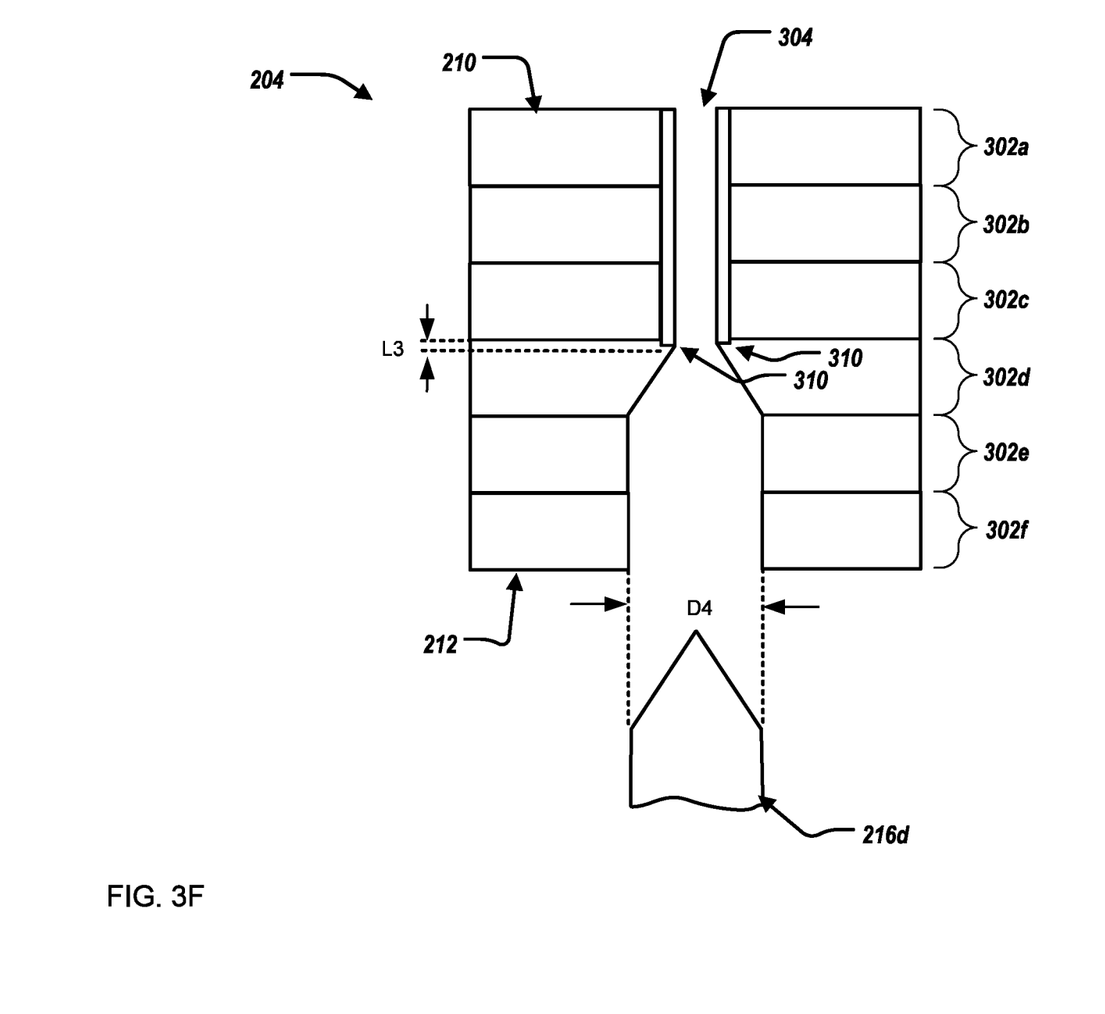
Figure 3G:
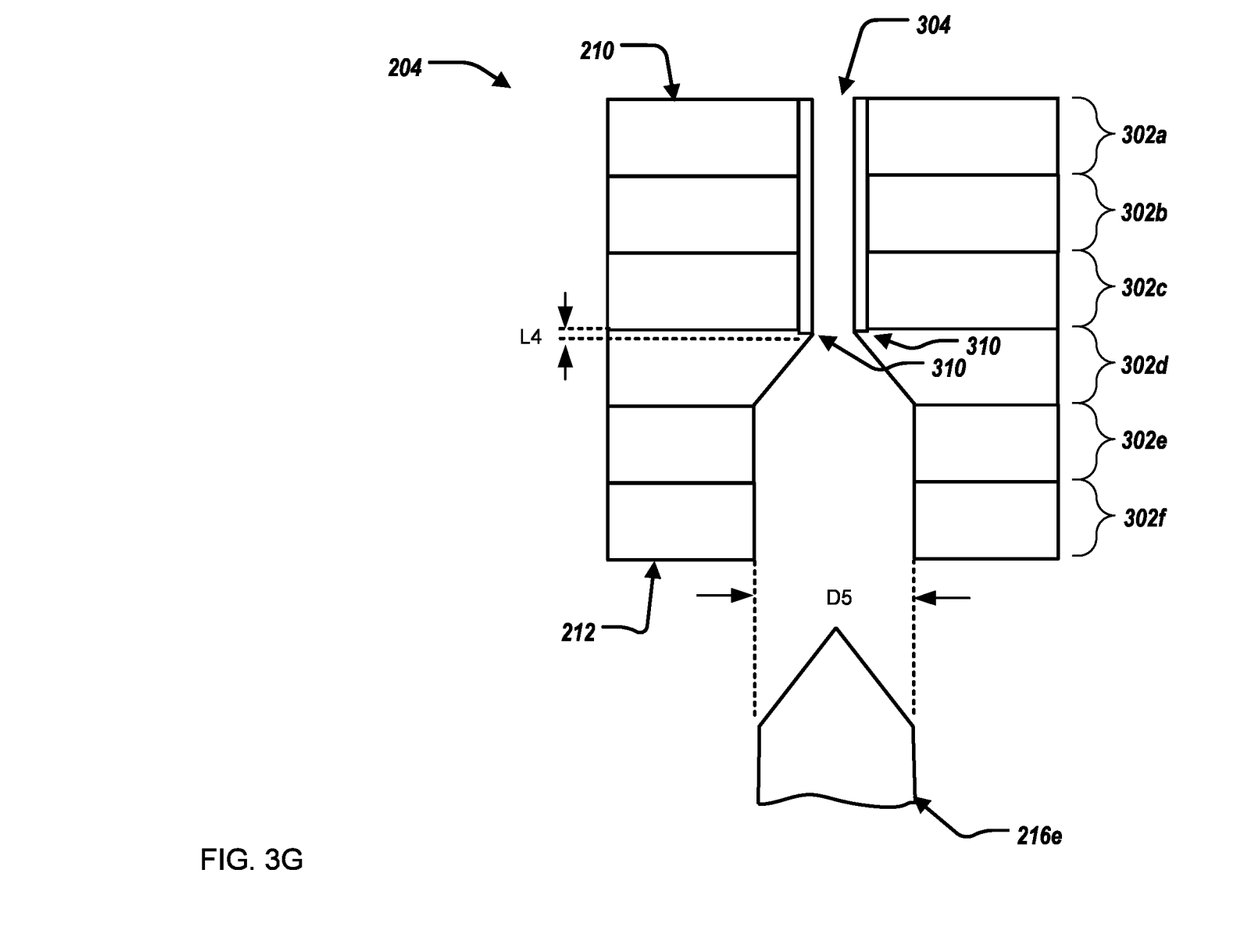
Figure 4:
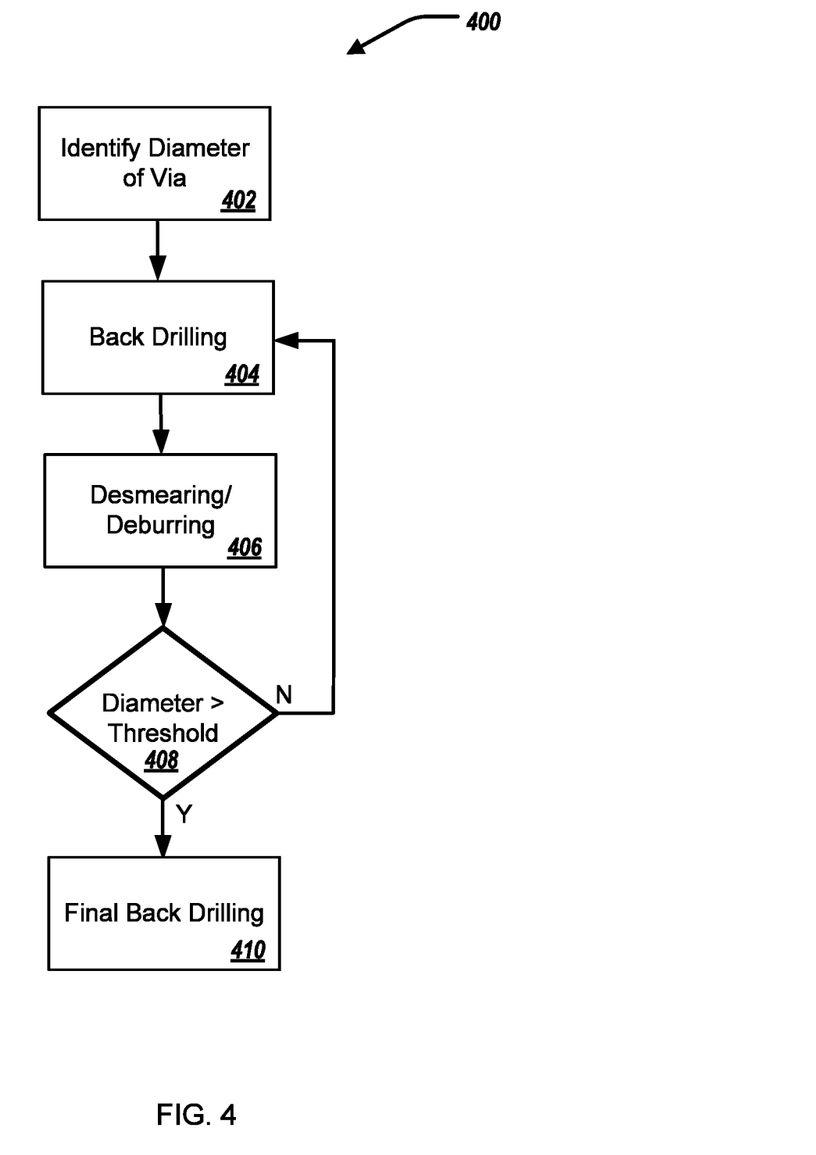
FIG. 4 illustrates a method for back drilling of vias of the PCB.

FIG. 4 illustrates a flowchart depicting selected elements of an embodiment of a method 400 for back drilling of vias of printed circuit board. The method 400 may be performed by the information handling system 100, the information handling system 202, the via management computing module 214, and/or the back drilling system 206, and with reference to FIGS. 1-3. It is noted that certain operations described in method 400 may be optional or may be rearranged in different embodiments.

The via management computing module 214 can identify the diameter D1 of the via 304 from the first side 210 of the PCB 204, at 402. That is, as described herein, the via management computing module 214 can send a control signal to the back drilling system 206 such that the first drill bit 216a forms the via 304 through the layers 302 of the PCB 204. The first drill bit 216a can be associated with the diameter D1 such that the via 304 has the diameter D1.

The via management computing module 214 can send a signal to the back drilling system 206 such that the back drilling system 206 can perform back drilling of the via 304 from the second side 212 of the PCB 204, at 404. Specifically, the via management computing module 214 can send a signal to the back drilling system 206 such that the back drilling system 206 can back drill the via 304 with a second drill bit 216b (of the drill bits 216) having a diameter D2, as shown in FIG. 3D, such that the via 304 will have the diameter D2 from the second side 212 of the PCB 204.

In some examples, the diameter D2 of the second drill bit 216b is greater than the diameter D1 of the via 304 at the first side 210 of the PCB 204. Specifically, the diameter D2 is a first percentage greater than the diameter D1 of the via 304 at the first side 210 of the PCB 204. For example, the diameter D1 can be 8 one-thousands of an inch (mils); and the diameter D2 can be 10 one-thousands of an inch (mils).

In short, back drilling of the via 304 can remove at least a portion of the plating 306 between layers 302d and the second side 212 of the PCB 204. Furthermore, during such back drilling, stubs 310 of the plating 306 can be formed as a result of the diameter D2 of the second drill bit 21ba. Specifically, based on the diameter D2 of the second drill bit 216b, the stubs 310 can have a length L1, as shown in FIG. 3D.

In some examples, after back drilling of the via 304 with the second drill bit 216b, desmearing and/or deburring of the via 304 can be performed, at 406.

The via management computing module 214 can determine whether the diameter D2 of the second drill bit 216b is a threshold percentage greater than the diameter D1 of the via 304 at the first side 210 of the PCB 204, at 408. In some examples, the threshold percentage is greater than the first percentage.

The via management computing module 214 can determine that the diameter D2 of the second drill bit 216b is less than the threshold percentage greater than the diameter D1 of the via 304 at the first side 210 of the PCB 204, and in response, the via management computing module 214 can send a signal to the back drilling system 206 such that the back drilling system 206 can perform additional back drilling of the via 304 from the second side 212 of the PCB 204, at 404. Specifically, the via management computing module 214 can send a signal to the back drilling system 206 such that the back drilling system 206 can back drill the via 304 with a third drill bit 216c (of the drill bits 216) having a diameter D3, as shown in FIG. 3E, such that the via 304 will have the diameter D3 from the second side 212 of the PCB 204.

In some examples, the diameter D3 (of the third drill bit 216c) is greater than the diameter D2 (of the second drill bit 216b). Additionally, the diameter D3 of the third drill bit 216c can be a third percentage greater than the diameter of the via 304 at the first side 210 of the PCB 204. For example, the diameter D3 can be 12 one-thousands of an inch (mils).

In short, additional back drilling of the via 304 can remove at least an additional portion of the plating 306 between layers 302d and the second side 212 of the PCB 204. Furthermore, during such additional back drilling, the length of the of the stubs 310 can be decreased to a length L2, as shown in FIG. 3E, less than the length L1. That is, the length L2 of the stubs 310 can be based on the diameter D3 of the third drill bit 216c.

In some examples, after additional back drilling of the via 304 with the third drill bit 216c, desmearing and/or deburring of the via 304 can be performed, at 406.

The via management computing module 214 can determine whether the diameter D3 of the third drill bit 216c is the threshold percentage greater than the diameter D1 of the via 304 at the first side 210 of the PCB 204, at 408.

The via management computing module 214 can determine that the diameter D3 of the third drill bit 216c is less than the threshold percentage greater than the diameter D1 of the via 304 at the first side 210 of the PCB 204, and in response, the via management computing module 214 can send a signal to the back drilling system 206 such that the back drilling system 206 can perform additional back drilling of the via 304 from the second side 212 of the PCB 204, at 404. Specifically, the via management computing module 214 can send a signal to the back drilling system 206 such that the back drilling system 206 can back drill the via 304 with a fourth drill bit 216d (of the drill bits 216) having a diameter D4, as shown in FIG. 3F, such that the via 304 will have the diameter D4 from the second side 212 of the PCB 204.

In some examples, the diameter D4 (of the fourth drill bit 216d) is greater than the diameter D3 (of the third drill bit 216c). Additionally, the diameter D4 can be a fourth percentage greater than the diameter of the via 304 at the first side 210 of the PCB 204. For example, the diameter D4 can be 14 one-thousands of an inch (mils).

In short, additional back drilling of the via 304 can remove at least an additional portion of the plating 306 between layers 302d and the second side 212 of the PCB 204. Furthermore, during such additional back drilling, the length of the stubs 310 can be decreased to a length L3, as shown in FIG. 3F, less than the length L2. That is, the length L3 of the stubs 310 can be based on the diameter D4 of the fourth drill bit 216d.

In some examples, after additional back drilling of the via 304 with the fourth drill bit 216d, desmearing and/or deburring of the via 304 can be performed, at 406.

The via management computing module 214 can determine whether the diameter D4 of the fourth drill bit 216d is the threshold percentage greater than the diameter D1 of the via 304 at the first side 210 of the PCB 204, at 408.

The via management computing module 214 can determine that the diameter D4 of the fourth drill bit 216d is at least the threshold percentage greater than the diameter D1 of the via 304 at the first side 210 of the PCB 204, and in response, the via management computing module 214 can send a signal to the back drilling system 206 such that the back drilling system 206 can perform one additional back drilling of the via 304 from the second side 212 of the PCB 204, at 410. Specifically, the via management computing module 214 can send a signal to the back drilling system 206 such that the back drilling system 206 can back drill the via 304 with a fifth drill bit 216e (of the drill bits 216) having a diameter D5, as shown in FIG. 3G, such that the via 304 will have the diameter D5 from the second side 212 of the PCB 204.

In some examples, the diameter D5 (of the fifth drill bit 216e) is greater than the diameter D4 (of the fourth drill bit 216d). Additionally, the diameter D5 can be a fifth percentage greater than the diameter D1 of the via 304 at the first side 210 of the PCB 204. For example, the diameter D5 can be 16 one-thousands of an inch (mils).

In short, additional back drilling of the via 304 can remove at least an additional portion of the plating 306 between layers 302d and the second side 212 of the PCB 204. Furthermore, during such additional back drilling, the length of the of the stubs 310 can be decreased to a length L4, as shown in FIG. 3G, less than the length L3. That is, the length L4 of the stubs 310 can be based on the diameter D5 of the fifth drill bit 216e.

In some examples, after back drilling of the via 204 with the fifth drill bit 216e, the via management computing module 214 can send a signal to the back drilling system 206 such that the back drilling system 206 can perform a second back drilling of the via 304 from the second side 212 of the PCB 204 with the fifth drill bit 216e.

In some examples, when any of the drill bits 216 performs back drilling of the via 204, the back drilling can remove at least a portion of the plating 306 between the layer 302d and a distance between the first side 210 and the second side 212 of the PCB 204 (between the layer 302d and the second side 212 of the PCB 204), as described further herein. Specifically, performing the back drilling of the via 204 can include removing a particular percentage of the portion of the plate 306 between the layer 302d and a distance between the first side 210 and the second side 212 of the PCB 204 (between the layer 302d and the second side 212 of the PCB 204). For example, after performing the second back drilling of the via 304 from the second side 212 of the PCB 204 with the fifth drill bit 216e, the particular percentage can be greater than ninety percent, greater than ninety-five percentage, or greater than ninety-nine percent.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method of forming vias of a printed circuit board (PCB), the method comprising:
    drilling of a particular via from a first side of the printed circuit board (PCB) with a first drill bit having a first diameter to form the particular via, the particular via being formed to have a particular diameter that is equal to the first diameter;
    back drilling of the particular via from a second side of the PCB, the second side being disposed opposite of the first side of the PCB, the back drilling including:
        back drilling of the particular via with a second drill bit having a second diameter, the second diameter a first percentage greater than the particular diameter of the particular via at the first side of the PCB;
        determining whether the second diameter of the second drill bit is a threshold percentage greater than the particular diameter of the particular via at the first side of the PCB;
        determining that the second diameter of the second drill bit is less than the threshold percentage greater than the particular diameter of the particular via at the first side of the PCB, and in response:
            back drilling of the particular via with a third drill bit having a third diameter, the third diameter a second percentage greater than the particular diameter of the particular via at the first side of the PCB, the third diameter greater than the second diameter;
            determining whether the third diameter of the third drill bit is the threshold percentage greater than the particular diameter of the particular via at the first side of the PCB; and
            determining that the third diameter of the third drill bit is less than the threshold percentage greater than the particular diameter of the particular via at the first side of the PCB, and in response, back drilling of the particular via with a fourth drill bit having a fourth diameter, the fourth diameter greater than the third diameter, wherein the particular via is plated, wherein back drilling of the particular via includes removing a portion of the plated particular via between the second side of the PCB and a distance between the first side of the PCB and the second side of the PCB.

2. The method of claim 1, further comprising:
after back drilling of the particular via with the second drill bit, performing desmearing and/or deburring at the particular via.

3. The method of claim 1, wherein the threshold percentage is greater than the first percentage.

4. The method of claim 1, further comprising:
determining that the fourth diameter of the fourth drill bit is at least the threshold percentage greater than the particular diameter of the particular via at the first side of the PCB, and in response:
back drilling of the particular via with a fifth drill bit having a fifth diameter, the fifth diameter a fourth percentage greater than the particular diameter of the particular via, the fifth diameter greater than the third diameter.

5. The method of claim 4, further comprising:
after back drilling of the particular via with the fifth drill bit, back drilling of the particular via with the fifth drill bit a second time.

6. The method of claim 4, wherein the fifth diameter of the fifth drill bit is greater than the fourth diameter of the fourth drill bit.

7. The method of claim 1, wherein removing the portion of the plated particular via between the second side of the PCB and the distance between the first side of the PCB and the second side of the PCB includes removing a particular percentage of the portion of the plated particular via between the second side of the PCB and the distance between the first side of the PCB and the second side of the PCB.

8. The method of claim 7, wherein the particular percentage is greater than ninety-nine percent.

* * * * *